United States Patent
Lee

(10) Patent No.: US 7,187,116 B2
(45) Date of Patent: Mar. 6, 2007

(54) BOTTOM EMISSION TYPE ELECTROLUMINESCENT DISPLAY WITH PARTIALLY REFLECTING ELECTRODES

(75) Inventor: Kwan-Hee Lee, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 148 days.

(21) Appl. No.: 10/795,524

(22) Filed: Mar. 9, 2004

(65) Prior Publication Data

US 2004/0263068 A1    Dec. 30, 2004

(30) Foreign Application Priority Data

Jun. 25, 2003    (KR) .................. 10-2003-0041441

(51) Int. Cl.
*H01L 51/50* (2006.01)
*H05B 33/24* (2006.01)
*H05B 33/26* (2006.01)

(52) U.S. Cl. .................. 313/503; 313/504; 313/506
(58) Field of Classification Search ............. 313/503, 313/504, 506
See application file for complete search history.

(56) References Cited

U.S. PATENT DOCUMENTS

| 4,539,507 A | 9/1985 | VanSlyke et al. ........... 313/504 |
| 6,905,788 B2* | 6/2005 | Tyan et al. .................. 313/506 |
| 2004/0140758 A1* | 7/2004 | Raychaudhuri et al. ..... 313/504 |
| 2005/0012455 A1* | 1/2005 | Lee et al. .................... 313/506 |
| 2005/0058852 A1* | 3/2005 | Tyan et al. .................. 313/504 |
| 2005/0162074 A1* | 7/2005 | Madathil et al. ............ 313/504 |

FOREIGN PATENT DOCUMENTS

| JP | 10069984 A | * 3/1998 |
| KR | 2003-0002182 | 1/2003 |
| WO | WO 200106576 A1 | * 1/2001 |

OTHER PUBLICATIONS

Official translation of foreign patent JP 10-069984 to Koike et al.*
"Organic Photo- and Electroluminescent Devices with Double Mirrors" by Takahiro Nakayama, Yuzo Itoh, and Atsushi Kahuta, *Applied Physics Letter*, vol. 63, Issue 5, pp. 594 and 595 (Aug. 2, 1993).

* cited by examiner

*Primary Examiner*—Mariceli Santiago
(74) *Attorney, Agent, or Firm*—H.C. Park & Associates, PLC

(57) ABSTRACT

A bottom emission type electroluminescent display in which light emitted from a light emitting layer undergoes constructive interference between a first electrode and a second electrode. The bottom emission type electroluminescent display has a transparent substrate, a first electrode and a second electrode. The first electrode and the second electrode are formed on the same side of the transparent substrate. The electroluminescent display also has a medium layer interposed between the first electrode and the second electrode and includes a light emission layer that emits light when the first electrode and the second electrode are electrically driven. The first electrode is formed as a translucent conductive layer that partially reflects the light emitted from the light emission layer and the second electrode is formed as a reflection layer that reflects the light emitted from the light emission layer.

6 Claims, 3 Drawing Sheets

BOTTOM EMISSION TYPE ELECTROLUMINESCENT DISPLAY WITH PARTIALLY REFLECTING ELECTRODES

This application claims priority from Korean Patent Application No. 2003-41441, filed on Jun. 25, 2003, in the Korean Intellectual Property Office, the disclosure of which is incorporated herein by reference in its entirety.

BACKGROUND OF THE INVENTION (a) Field of the Invention

The invention relates to a bottom emission type electroluminescent display.

(b) Description of the Related Art

Electroluminescent displays are active light-emitting display devices and have many advantages over cathode ray tubes (CRTs) or liquid crystal displays (LCDs). For example, electroluminescent displays have a wide viewing angle, high contrast, fast response speed, light weight, small size, thin thickness, and low power consumption. Therefore, there has been an increasing interest in electroluminescent displays. Electroluminescent displays are generally classified as inorganic electroluminescent displays and organic electroluminescent displays based on whether a light emission layer is made of an inorganic material or an organic material.

FIG. 1 shows a conventional electroluminescent display having a structure similar to the structure disclosed in U.S. Pat. No. 4,539,507. The electroluminescent display of FIG. 1 has a stacked structure including an anode 20, a medium layer 30, and a cathode 40 on a transparent substrate 10. As shown in FIG. 1, the medium layer comprises a hole injection layer 31, a hole transport layer 32, a light emitting layer 33, an electron transport layer 34, and an electron injection layer 35. However, all the layers, except for the light emission layer, may be omitted as needed. The anode 20 is made of a transparent material, such as indium tin oxide (ITO). While some light emitted from the light emitting layer 33 is reflected by the cathode 40 and then discharged through the anode 20 and the transparent substrate 10, other light is directly discharged through the anode 20 and the transparent substrate 10 without being reflected by the cathode 40. However, since light emitted from the light emitting layer undergoes once constructive interference one time before being discharged from the electroluminescent display, enhancement of light emission characteristics is slight.

FIG. 2 shows a top emission type electroluminescent display as disclosed in *Applied Physics Letter*, Vol. 63, 594 (1993). In this electroluminescent display, some light emitted from a light emitting layer 33 undergoes constructive interference by anode 20 and a partial reflection layer 50.

SUMMARY OF THE INVENTION

The invention provides an electroluminescent display in which light emitted from a light emitting layer undergoes constructive interference between a first electrode and a second electrode two or more times. Therefore, the electroluminescent display has the enhanced light emission characteristics such as enhanced luminance, chromaticity, and light efficiency.

According to an aspect of the invention, there is provided a bottom emission type electroluminescent display comprising a transparent substrate, a first electrode and a second electrode. The first electrode and the second electrode are formed on the same side of the transparent substrate. A medium layer is interposed between the first electrode and the second electrode and the medium layer comprises a light emission layer that emits light when the first electrode and the second electrode are electrically driven. The first electrode is formed as a translucent conductive layer that partially reflects the light emitted from the light emitting layer and the second electrode is formed as a reflection layer that reflects the light emitted from the light emitting layer.

The first electrode may be formed as a single layer. In this case, the medium layer interposed between the first electrode and the second electrode may be formed so that light reflected by the first electrode and the second electrode undergoes constructive interference. The medium layer interposed between the first electrode and the second electrode may have a thickness and a refractive index which maximizes the luminance of light discharged from the electroluminescent display. The first electrode may be made of a composite material comprising a transparent material and a partially reflective material. The transparent material may be selected from the group consisting of indium tin oxide (ITO), indium zinc oxide (IZO), aluminum tin oxide (ATO), and zinc oxide (ZnO), and the partially reflective material may be selected from the group consisting of Ag, Mg, Al, Pt, Pd, Au, Ni, Ir, and Cr. The first electrode may have a light transmittance of about 20% to about 80%.

The first electrode may comprise a first transparent conductive layer that transmits light and a partial reflection layer that partially reflects light. In this case, the partial reflection layer may be interposed between the medium layer and the first transparent conductive layer. Alternatively, the first transparent conductive layer is formed on both surfaces of the partial reflection layer. The layer interposed between the partial reflection layer and the second electrode may be formed so that light reflected by the partial reflection layer and the second electrode undergoes constructive interference. The layer interposed between the partial reflection layer and the second electrode may have a thickness and a refractive index which maximizes the luminance of light discharged from the electroluminescent display. The first transparent conductive layer may be made of a transparent material selected from the group consisting of ITO, IZO, ATO, and ZnO, and the partial reflection layer may be made of a partially reflective material selected from the group consisting of Ag, Mg, Al, Pt, Pd, Au, Ni, Ir, and Cr. The partial reflection layer may have a light transmittance of about 20% to about 80%. The partial reflection layer made of Ag or Ag alloy may have a thickness of about 5 nm to about 30 nm, the partial reflection layer made of Al or Al alloy may have a thickness of about 2 nm to about 10 nm, and the partial reflection layer made of Mg or Mg alloy may have a thickness of about 3 nm to about 15 nm.

BRIEF DESCRIPTION OF THE DRAWINGS

The above and other features and advantages of the invention will become more apparent by describing in detail exemplary embodiments thereof with reference to the attached drawings.

DETAILED DESCRIPTION OF THE INVENTION

Figure 1:
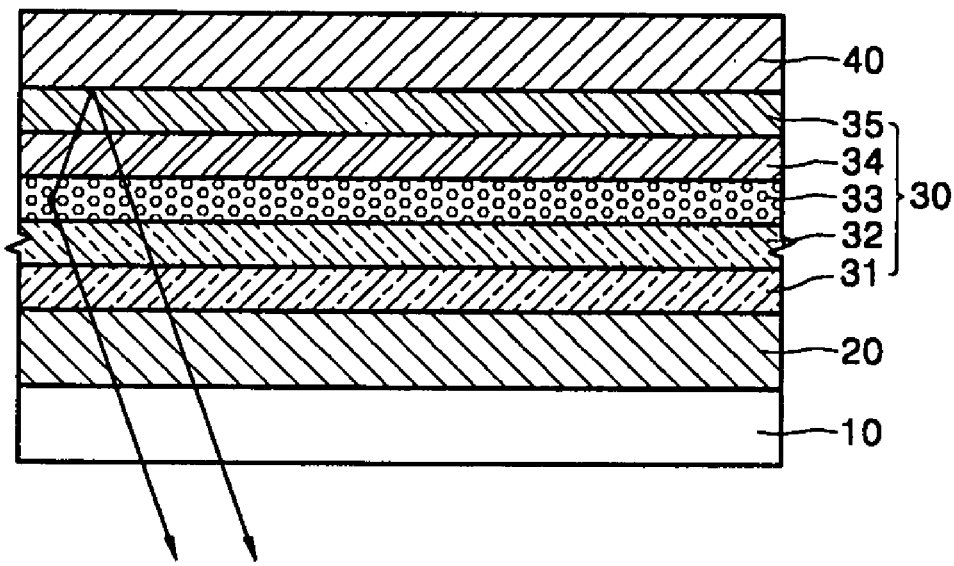
FIG. 1 is a sectional view of a conventional electroluminescent display.
Figure 2:
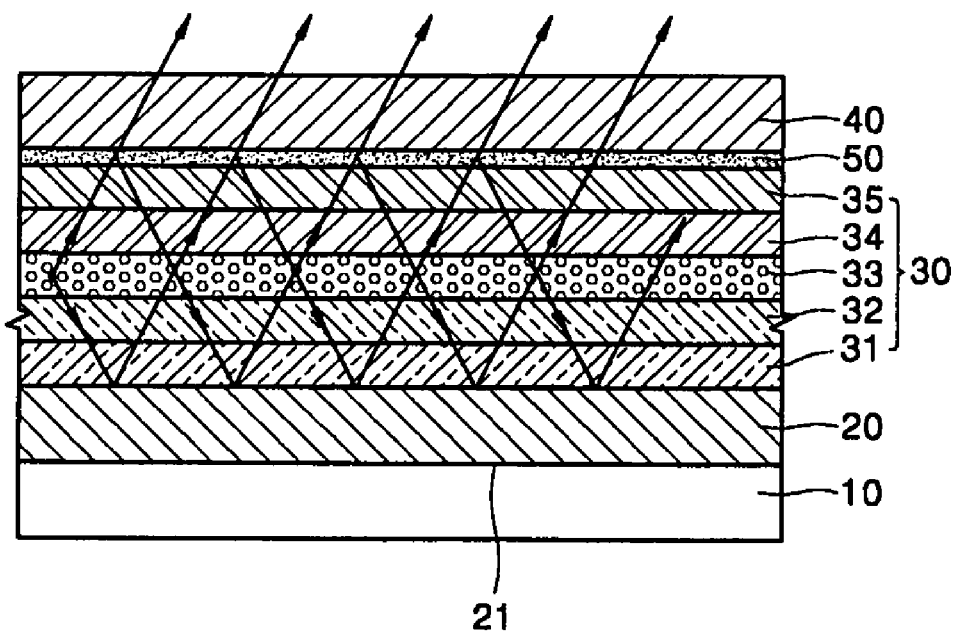
FIG. 2 is a sectional view of another conventional electroluminescent display.
Figure 3:
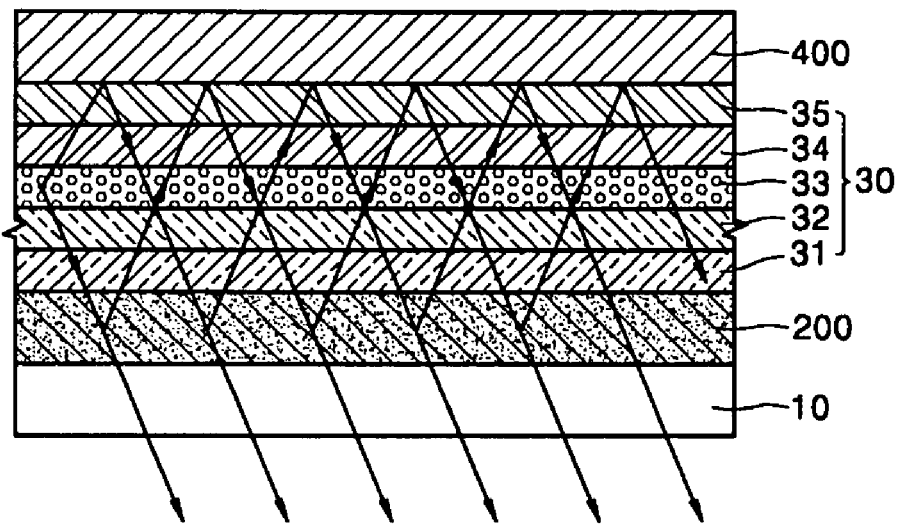
FIG. 3 is a sectional view of a bottom emission type electroluminescent display according to a first exemplary embodiment of the invention.

Hereinafter, an electroluminescent display according to a first exemplary embodiment of the invention will be described with reference to FIG. 3.

A bottom emission type electroluminescent display according to this exemplary embodiment comprises a transparent substrate 10, a first electrode 200, a second electrode 400, and a medium layer 30. The transparent substrate 10 may be a glass substrate, and the first electrode, the medium layer, and the second electrode are formed consecutively on the substrate. It should be understood that other layers may be included as well. One of the first electrode 200 and the second electrode 400 is an anode and the other electrode is a cathode. In all exemplary embodiments of the invention described herein including this embodiment, the first electrode is set as an anode and the second electrode is set as a cathode. However, the first electrode may be a cathode and the second electrode may be an anode.

The medium layer 30 is interposed between the anode 200 and the cathode 400 and comprises a light emitting layer 33 that emits light when the anode and the cathode are electrically driven. FIG. 3 shows that the medium layer comprises a hole injection layer 31, a hole transport layer 32, the light emitting layer 33, an electron transport layer 34, and an electron injection layer 35. However, all the layers, except for the light emission layer, may be omitted as needed. An electroluminescent display can be an organic electroluminescent display and an inorganic electroluminescent display based on the materials of the light emitting layer 33.

The light emission layer 33 of an organic electroluminescent display may be made of phthalocyanine, such as, copper phthalocyanine (CuPc), N,N'-di(naphthalene-1-yl)-N,N'-diphenyl benzidine (NPB), or tris-8-hydroxyquinoline aluminium (Alq3). The light emitting layer 33 of an inorganic electroluminescent display may be made of metal sulfide such as ZnS, SrS, and CsS or alkaline earth-based calcium sulfide such as $CaCa_2S_4$ and $SrCa_2S_4$, and the light emitting core atoms of transition metals, such as, Mn, Ce, Tb, Eu, Tm, Er, Pr, and Pb or alkaline rare earth metals. Although FIG. 3 shows an organic electroluminescent display, an inorganic electroluminescent display is also within the scope of the invention. For an inorganic electroluminescent display, insulating layers are interposed between the first electrode and the light emission layer and between the second electrode and the light emission layer.

The anode 200 and the cathode 400 are located at the same side of the transparent substrate, and the medium layer 30 comprising the light emitting layer 33 is interposed therebetween. In particular, in this exemplary embodiment of the invention, the anode 200 is formed as a single layer made of a translucent conductive material, which is different from the other exemplary embodiments of the invention which will be described later. Since the anode is formed as a single layer in this embodiment, a manufacturing process is simplified relative to the other exemplary embodiments.

In this exemplary embodiment, the anode 200 is formed as a translucent conductive layer which allows some light emitted from the light emitting layer 33 to be reflected while simultaneously transmitting other light. The cathode 400 is formed as a reflection layer that allows light to be reflected. While the cathode allows all light to be reflected, the anode allows some light to be reflected. Therefore, some light emitted from the light emitting layer vibrates between the anode and the cathode, as represented by the arrows in FIG. 3. The vibrating light undergoes constructive interference two or more times according to the wavelength of the light, the refractive index and the thickness of the medium layer interposed between the anode and the cathode and before being discharged through the anode 200 and the transparent substrate 10. Therefore, an electroluminescent display according to this exemplary embodiment has the enhancements in light emission characteristics, such as, enhanced luminance, enhanced chromaticity, and enhanced light efficiency.

The anode 200 may be made of a composite material comprising a transparent material and a partially reflective material. The transparent material may be selected from the group consisting of indium tin oxide (ITO), indium zinc oxide (IZO), aluminum tin oxide (ATO), and zinc oxide (ZnO), and the partially reflective material may be selected from the group consisting of Ag, Mg, Al, Pt, Pd, Au, Ni, Ir, and Cr. In various exemplary embodiments according to the invention, the anode has a light transmittance of about 20% to about 80%.

Generally, if the light transmittance of the anode is less than about 20%, light reflectivity increases excessively. As a result, light is trapped between the anode 200 and the cathode 400, thereby decreasing the luminance and the light efficiency of an electroluminescent display. On the other hand, if the light transmittance of the anode exceeds about 80%, light reflectivity decreases excessively. As a result, the constructive interference of light occurs insufficiently, which makes it difficult to enhance the luminance and the light efficiency. For reference, the anode has light absorptivity of 30% or less and the sum of light absorptivity, reflectivity, and transmittance of the anode is about 100%. The light transmittance of the anode can be adjusted, for example, by controlling the ratio of the transparent material to the partially reflective material or the oxygen content of the anode. The cathode may be made of a conventional material, such as, for example, LiF/Al, Mg/Ag, or Ca/Ag.

In this embodiment, the medium layer may wholly or partially comprise the hole injection layer 31, the hole transport layer 32, the light emitting layer 33, the electron transport layer 34, and the electron injection layer 35. Generally, these layers may be optimized so that light reflected by the anode and the cathode undergoes constructive interference. The medium layer generally has a thickness and a refractive index which maximizes the luminance (Et) of light discharged from an electroluminescent display. The luminance (Et) may be calculated from Equation 1 below.

$$\left(\frac{E_t}{E_o}\right)_1 = te^{i\frac{2\pi}{\lambda}n_2 d}\left[\begin{array}{l}1 + r're^{i\frac{2\pi}{\lambda}n_2(4d)} + \\ \left\{r're^{i\frac{2\pi}{\lambda}n_2(4d)}\right\}^2 + ...\end{array}\right] +$$

$$tr'e^{i\frac{2\pi}{\lambda}n_2(3d)}\left[\begin{array}{l}1 + r're^{i\frac{2\pi}{\lambda}n_2(4d)} + \\ \left\{r're^{i\frac{2\pi}{\lambda}n_2(4d)}\right\}^2 + ...\end{array}\right]$$

Equation 1

-continued $$= te^{i\frac{2\pi}{\lambda}n_2 d}\frac{1+r'e^{i\frac{2\pi}{\lambda}n_2(2d)}}{1-rr'e^{i\frac{2\pi}{\lambda}n_2(4d)}}$$

wherein $E_o$ is the luminance of light emitted from the light emitting layer 33, $E_t$ is the luminance of the light discharged from an electroluminescent display, t is the light transmittance of the anode 200, λ is the wavelength of light emitted from the light emitting layer 33, $n_2$ is the refractive index of the medium layer 30 interposed between the anode and the cathode, d is a half of the thickness of the medium layer 30, r is the light reflectivity of the anode 200, and r' is the light reflectivity of the cathode 400.

Figure 4:
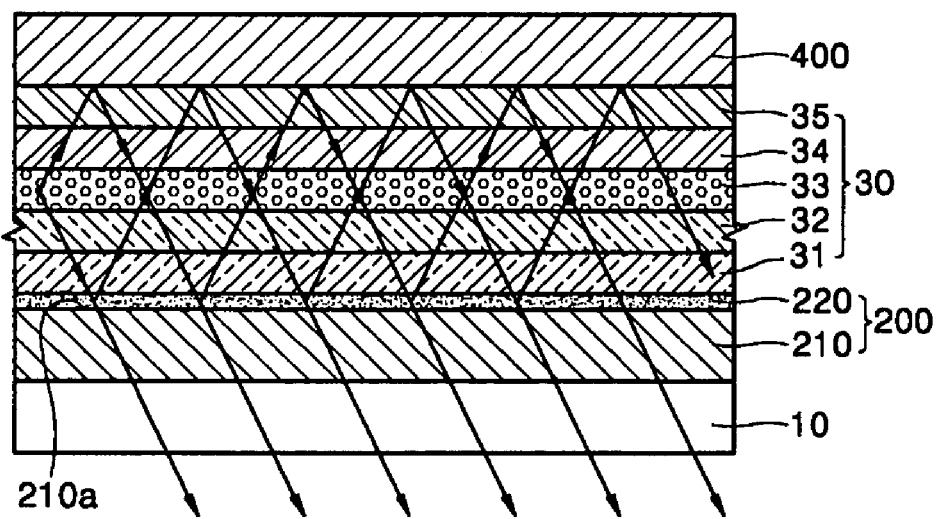
FIG. 4 is a sectional view of a bottom emission type electroluminescent display according to a second exemplary embodiment of the invention.

An electroluminescent display according to a second exemplary embodiment of the invention will now be described with reference to FIG. 4. Only the differences between the first embodiment and the second embodiment will be discussed. In this exemplary embodiment, the anode 200 comprises a first transparent conductive layer 210 that transmits light and a partial reflection layer 220 that partially reflects light, instead of using a single translucent conductive layer. Layers interposed between the partial reflection layer 220 and the cathode 400 are formed so that light reflected by the partial reflection layer and the cathode undergoes constructive interference.

Since the anode comprises the partial reflection layer 220 that allows some light to be reflected while other light is transmitted through the layer, a reflection distance decreases (see FIG. 4), when compared to the first embodiment. Therefore, the constructive interference of light occurs more efficiently. In particular, since the partial reflection layer 220 is formed on an interior surface 210a, some light emitted from the light emission layer 33 vibrates between the partial reflection layer 220 and the cathode 400, as represented by arrows in FIG. 4. The vibrating light undergoes constructive interference according to the wavelength of the light, the refractive index and the thickness of the medium layer interposed between the partial reflection layer and the cathode before being discharged outside. Therefore, an electroluminescent display according to this exemplary embodiment has enhanced light emission characteristics such as enhanced luminance, enhanced chromaticity, and enhanced light efficiency.

The first transparent conductive layer 210 may be made of a transparent material selected from the group consisting of ITO, IZO, ATO, and ZnO, and the partial reflection layer 220 may be made of a partially reflective material selected from the group consisting of Ag, Mg, Al, Pt, Pd, Au, Ni, Ir, and Cr.

In this exemplary embodiment, the medium layer 30 interposed between the partial reflection layer 220 and the cathode 400 may wholly or partially comprise a hole injection layer 31, a hole transport layer 32, a light emitting layer 33, an electron transport layer 34, and an electron injection layer 35. In various embodiments of the invention, the medium layer may be interposed between the partial reflection layer 220 and the cathode 400 may be formed so that light reflected by the partial reflection layer 220 and the cathode 400 undergoes constructive interference. In detail, the medium layer has a thickness and a refractive index which maximizes the luminance ($E_t$) of light discharged from an electroluminescent display. The luminance ($E_t$) may be calculated from Equation 1 above.

Applying Equation 1 to this exemplary embodiment, $E_o$ is the luminance of light emitted from the light emitting layer 33, $E_t$ is the luminance of light discharged from an electroluminescent display, t is the light transmittance of the partial reflection layer 220, λ is the wavelength of light emitted from the light emission layer 33, $n_2$ is the refractive index of the medium layer 30 interposed between the partial reflection layer and the cathode, d is a half of the thickness of the medium layer 30, r is the light reflectivity of the partial reflection layer 220, and r' is the light reflectivity of the cathode 400.

In various embodiments of the invention, the first transparent conductive layer has a thickness of about 50 nm to about 300 nm. If the thickness of the first transparent conductive layer is less than about 50 nm, conductivity decreases. On the other hand, if it exceeds 300 nm, a light transmittance decreases and a material cost increases.

In various embodiments of the invention, the partial reflection layer 220 may have a light transmittance of about 20% to about 80%. If the light transmittance of the partial reflection layer is less than about 20%, light reflectivity increases excessively. As a result, light is trapped between the partial reflection layer 220 and the cathode 400, thereby decreasing the luminance and the light efficiency of an electroluminescent display. On the other hand, if the light transmittance of the partial reflection layer 220 exceeds about 80%, light reflectivity decreases excessively. As a result, the constructive interference of light occurs insufficiently, which makes it difficult to enhance the luminance and the light efficiency. For reference, the partial reflection layer has light absorptivity of about 30% or less and the sum of light absorptivity, reflectivity, and transmittance of the partial reflection layer is about or equal to 100%.

According to the results obtained from experiments, in order to have a light transmittance of about 20% to about 80%, the partial reflection layer made of Ag or Ag alloy must have a thickness of about 5 nm to about 30 nm, the partial reflection layer made of Al or Al alloy must have a thickness of about 2 nm to about 10 nm, and the partial reflection layer made of Mg or Mg alloy must have a thickness of about 3 nm to about 15 nm.

Figure 5:
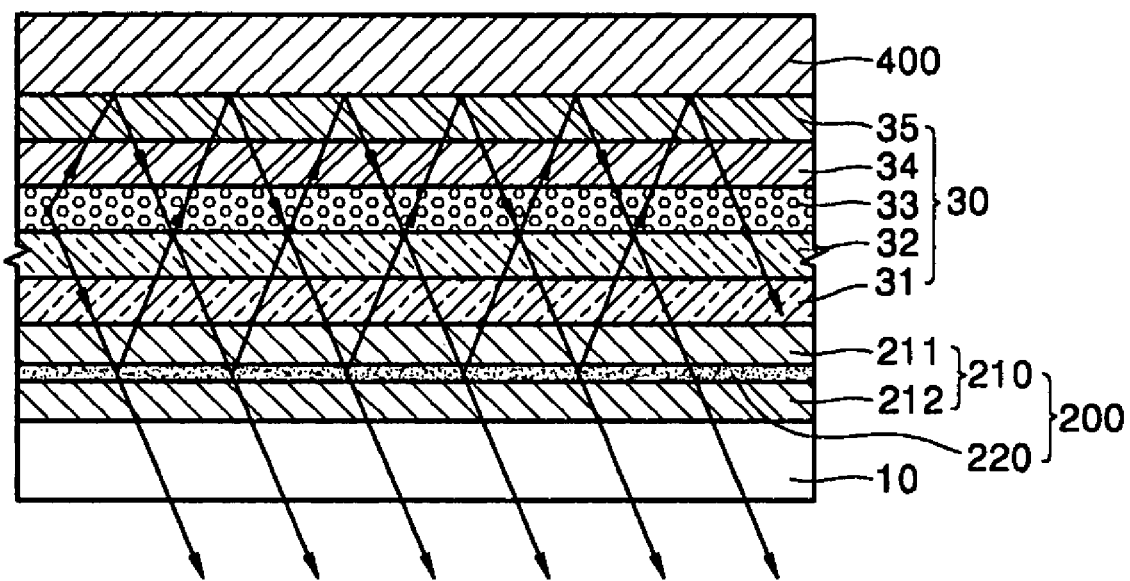
FIG. 5 is a sectional view of a bottom emission type electroluminescent display according to a third exemplary embodiment of the invention.

An electroluminescent display according to a third exemplary embodiment of the invention will now be described in detail with reference to FIG. 5. Only differences between the second exemplary embodiment and the third exemplary embodiment will be discussed below. In this exemplary embodiment a first transparent conductive layer 210 is formed on both surfaces of a partial reflection layer 220. That is, the first transparent conductive layer comprises a first upper transparent conductive layer 211 and a first lower transparent conductive layer 212, and the partial reflection layer is interposed therebetween.

When the partial reflection layer 220 is in direct contact with organic material layers, the related problems due to an energy level difference may be caused. In order to solve these problems, the first upper transparent conductive layer 211 is required to be interposed between the partial reflection layer and the organic material layers.

In this exemplary embodiment, the first upper transparent conductive layer 211 and the medium layer 30 are interposed between the partial reflection layer 220 and the cathode 400. The medium layer 30 may wholly or partially comprise a hole injection layer 31, a hole transport layer 32, a light emitting layer 33, an electron transport layer 34, and an electron injection layer 35. In various exemplary embodiments of the invention, the layers interposed between the partial reflection layer 220 and the cathode 400 are optimized so that light reflected by the partial reflection layer 220 and the cathode 400 undergoes constructive interference. The layers interposed between the partial reflection layer and the cathode may have a thickness and a refractive index which maximizes the luminance ($E_t$) of light discharged from an electroluminescent display. The luminance ($E_t$) may be calculated from Equation 1 above.

Applying Equation 1 to this embodiment, $E_o$ is the luminance of light emitted from the light emission layer 33, $E_t$ is the luminance of light discharged from an electroluminescent display, t is the light transmittance of the partial reflection layer 220, $\lambda$ is the wavelength of light emitted from the light emitting layer 33, $n_2$ is the refractive index of the layers interposed between the partial reflection layer and the cathode, d is a half of the thickness of the layers interposed between the partial reflection layer and the cathode, r is the light reflectivity of the partial reflection layer 220, and r' is the light reflectivity of the cathode 400.

As is apparent from the above description, the invention provides a bottom emission type electroluminescent display with enhanced luminance, chromaticity, and light efficiency. The bottom emission type electroluminescent display has high luminance, which makes it possible to reduce a driving power required for obtaining a desired luminance.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A bottom emission type electroluminescent display, comprising:
   a transparent substrate;
   a first electrode and a second electrode formed on a same side of the transparent substrate; and
   a medium layer interposed between the first electrode and the second electrode and comprising a light emitting layer that emits light when the first electrode and the second electrode are electrically driven,
   wherein the first electrode is formed as a translucent conductive layer that partially reflects the light emitted from the light emitting layer and the second electrode is formed as a reflection layer that reflects the light emitted from the light emitting layer, and the first electrode is formed as a single layer.

2. The bottom emission type electroluminescent display of claim 1, wherein the medium layer interposed between the first electrode and the second electrode is formed so that light reflected by the first electrode and the second electrode undergoes constructive interference.

3. The bottom emission type electroluminescent display of claim 2, wherein the medium layer interposed between the first electrode and the second electrode has a thickness and a refractive index which substantially maximize the value of $E_t$ in the following formula:

$$\left(\frac{E_t}{E_o}\right) = te^{i\frac{2\pi}{\lambda}n_2 d}\left[\begin{array}{c}1 + r're^{i\frac{2\pi}{\lambda}n_2(4d)} + \\ \left\{r're^{i\frac{2\pi}{\lambda}n_2(4d)}\right\}^2 + \ldots\end{array}\right] +$$

$$tr'e^{i\frac{2\pi}{\lambda}n_2(3d)}\left[\begin{array}{c}1 + r're^{i\frac{2\pi}{\lambda}n_2(4d)} + \\ \left\{r're^{i\frac{2\pi}{\lambda}n_2(4d)}\right\}^2 + \ldots\end{array}\right]$$

$$= te^{i\frac{2\pi}{\lambda}n_2 d}\frac{1 + r'e^{i\frac{2\pi}{\lambda}n_2(2d)}}{1 - rr'e^{i\frac{2\pi}{\lambda}n_2(4d)}}.$$

wherein $E_t$ is a luminance of light discharged from the bottom emission type electroluminescent display, $E_o$ is a luminance of light emitted from the light emitting layer, t is a light transmittance of the first layer, $\lambda$ is a wavelength of light emitted from the light emitting layer, $n_2$ is a refractive index of the medium layer, $2d$ is a thickness of the medium layer, r is a light reflectivity of the first layer, r' is a light reflectivity of the second layer, e represents an exponential function, and i represents an imaginary number.

4. The bottom emission type electroluminescent display according to claim 1, wherein the first electrode is made of a composite material comprising a transparent material and a partially reflective material.

5. The bottom emission type electroluminescent display according to claim 4, wherein the transparent material is selected from the group consisting of indium zinc oxide (IZO), aluminum tin oxide (ATO), and zinc oxide (ZnO), an reflective material selected from the group consisting of Ag, Mg, Al, Pt, Pd, Au, Ni, Ir, and Cr.

6. The bottom emission type electroluminescent display of claim 1, wherein the first electrode has a light transmittance of about 20% to about 80%.

* * * * *